United States Patent
Bourstein (10) Patent No.: US 9,621,303 B2
(45) Date of Patent: Apr. 11, 2017

(54) METHOD AND APPARATUS FOR VALID ENCODING

(71) Applicant: MARVELL ISRAEL (M.I.S.L) LTD., Yokneam (IL)

(72) Inventor: Ido Bourstein, Pardes Hana (IL)

(73) Assignee: Marvell Israel (M.I.S.L) Ltd., Yokneam (IL)

(*) Notice: Subject to any disclaimer, the term of this patent is extended or adjusted under 35 U.S.C. 154(b) by 135 days.

(21) Appl. No.: 14/608,319

(22) Filed: Jan. 29, 2015

(65) Prior Publication Data
US 2015/0212156 A1 Jul. 30, 2015

Related U.S. Application Data

(60) Provisional application No. 61/933,119, filed on Jan. 29, 2014, provisional application No. 61/977,009, filed on Apr. 8, 2014, provisional application No. 62/099,924, filed on Jan. 5, 2015.

(51) Int. Cl.
| | |
|---|---|
| *G06F 11/00* | (2006.01) |
| *H03M 13/00* | (2006.01) |
| *H04L 1/00* | (2006.01) |
| *H03M 13/01* | (2006.01) |
| *H03M 5/02* | (2006.01) |

(52) U.S. Cl.
CPC ............ *H04L 1/0042* (2013.01); *H03M 5/02* (2013.01); *H03M 13/01* (2013.01)

(58) Field of Classification Search
CPC ... H04L 1/0041; H04L 1/0045; H04L 1/0067; H04L 1/0042; G06F 11/10; G06F 11/1004; G06F 11/1625; H03M 13/01
See application file for complete search history.

(56) References Cited

U.S. PATENT DOCUMENTS

| | | | | |
|---|---|---|---|---|
| 6,584,526 | B1* | 6/2003 | Bogin | G06F 11/10 710/124 |
| 7,849,390 | B2* | 12/2010 | Nieuwland | G06F 11/10 714/801 |
| 8,117,526 | B2* | 2/2012 | Skerlj | H04L 1/0045 710/124 |
| 8,127,204 | B2* | 2/2012 | Hargan | G06F 11/1625 714/766 |
| 2011/0239084 | A1* | 9/2011 | Abbasfar | G06F 11/1004 714/758 |
| 2012/0206280 | A1* | 8/2012 | Abbasfar | G06F 13/4072 341/51 |

OTHER PUBLICATIONS

Stan et al., Bus invert coding for low power I/O, Mar. 1995, IEEE trans. on very large scale Integration (VLSI) systems, vol. 3, No. 1, pp. 49 to 58.*

* cited by examiner

*Primary Examiner* — Shelly A Chase (57) ABSTRACT

Aspects of the disclosure provide a circuit including an encoding circuit and a valid circuit. The encoding circuit is configured to encode data to be transmitted as signals on a data bus to satisfy a requirement that limits a number of bit transitions between consecutive transmissions. The valid circuit is configured to selectively corrupt the signals not to satisfy the requirement that limits the number of bit transitions between the consecutive transmissions to indicate whether the signals to be transmitted on the data bus constitute valid data or invalid data.

19 Claims, 6 Drawing Sheets

| TIME (N) | 0 | 1 | 2 | 3 | 4 | 5 | 6 | 7 |
|---|---|---|---|---|---|---|---|---|
| TX_DBI[N] | 0 | 0 | 1 | 1 | 1 | 1 | 1 | 0 |
| TX_DOUT[N][0] | 0 | 0 | 0 | 0 | 1 | 0 | 0 | 0 |
| TX_DOUT[N][1] | 0 | 1 | 1 | 0 | 1 | 0 | 1 | 1 |
| TX_DOUT[N][2] | 0 | 0 | 0 | 0 | 1 | 0 | 0 | 0 |
| TX_DOUT[N][3] | 0 | 1 | 1 | 0 | 1 | 0 | 1 | 1 |
| TX_DOUT[N][4] | 0 | 0 | 1 | 0 | 0 | 0 | 1 | 0 |
| TX_DOUT[N][5] | 0 | 0 | 1 | 0 | 0 | 0 | 0 | 1 |
| TX_DOUT[N][6] | 0 | 0 | 0 | 1 | 1 | 0 | 1 | 0 |
| TX_VALID | 1 | 1 | 1 | 1 | 0 | 0 | 1 | 1 |
| TX_INVERT_DATA | 0 | 0 | 0 | 0 | 1 | 0 | 0 | 0 |
| TX_GATED_CLK | A | A | A | A | G | G | A | A |
| TX_CLK_OUT | A | A | A | A | 5 | 5 | A | A |
| # OF TRAN | 1 | 3 | 2 | 4 | 5 | 5 | 4 | 2 |

FIG. 3

| TIME (N) | 0 | 1 | 2 | 3 | 4 | 5 | 6 | 7 |
|---|---|---|---|---|---|---|---|---|
| # OF TRAN | 0 | 3 | 2 | 4 | 5 | 5 | 4 | 2 |
| RX_DOUT[N][0] | 0 | 0 | 1 | 1 | X | X | 1 | 0 |
| RX_DOUT[N][1] | 0 | 1 | 0 | 1 | X | X | 0 | 1 |
| RX_DOUT[N][2] | 0 | 0 | 1 | 1 | X | X | 1 | 0 |
| RX_DOUT[N][3] | 0 | 0 | 0 | 1 | X | X | 0 | 1 |
| RX_DOUT[N][4] | 0 | 1 | 0 | 1 | X | X | 0 | 0 |
| RX_DOUT[N][5] | 0 | 0 | 1 | 1 | X | X | 1 | 0 |
| RX_DOUT[N][6] | 0 | 0 | 0 | 0 | X | X | 0 | 0 |
| RX_DOUT[N][7] | 1 | 1 | 1 | 1 | 0 | 0 | 1 | 1 |
| RX_VALID | A | A | A | A | A | G | A | A |
| RX_CLK | 0 | 0 | 1 | 1 | 1 | 1 | 1 | 0 |

METHOD AND APPARATUS FOR VALID ENCODING

INCORPORATION BY REFERENCE

This present disclosure claims the benefit of U.S. Provisional Application No. 61/933,119, "Valid Encode Through AC DBI" filed on Jan. 29, 2014, U.S. Provisional Application No. 61/977,009, "Valid Encode Through AC DBI" filed on Apr. 8, 2014, and U.S. Provisional Application No. 62/099,924, "Valid Encode Through AC DBI" filed on Jan. 5, 2015, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In various integrated circuits large amounts of data are passed among different modules of an integrated circuit device, which in some emerging architectures are distributed among separate but communicatively coupled chips. Data-bit inversion (DBI) is a technique used in data transfer to minimize noise generation and reduce error probability. In an example, a DBI signal is added into a data bus and is transmitted with data bits on the data bus. The DBI signal is used to indicate whether the data bits on the data bus are inverted. In an AC DBI mode, the data bits on the data bus are suitably inverted to reduce the number of bit-transitions between consecutive transmissions on the data bus, and thus reduce noise generation and error probability. Conventionally, an additional dedicated valid signal is provided to facilitate determination of whether signals on the data bus indeed constitute valid data or merely noise.

SUMMARY

Aspects of the disclosure provide a circuit including an encoding circuit and a valid circuit. The encoding circuit is configured to encode data to be transmitted as signals on a data bus to satisfy a requirement that limits a number of bit transitions between consecutive transmissions. The valid circuit is configured to selectively corrupt the signals not to satisfy the requirement that limits the number of bit transitions between the consecutive transmissions to indicate whether the signals to be transmitted on the data bus constitute valid data or invalid data.

According to an aspect of the disclosure, the encoding circuit is configured to encode the data to be transmitted as the signals on the data bus to satisfy the requirement that limits a maximum number of bit transitions between the consecutive transmissions to be a half of a data bus width.

In an embodiment, the encoding circuit includes a logic circuit configured to generate a data-bit inversion (DBI) signal based on bit transitions between signals to be transmitted as a first data unit, and a second data unit subsequent to the first data unit, and an XOR circuit configured to combine the second data unit with the DBI signal to encode the second data unit.

Further, in an embodiment, the valid circuit includes a logic circuit configured to generate a corruption inversion signal in response to a valid signal that indicates whether the signals being transmitted on the data bus constitutes valid data or invalid data, and an XOR circuit configured to combine at least a portion of the encoded data with the corruption inversion signal. In an example, the logic circuit is configured to gate a clock signal in response to the valid signal, and the encoding circuit is configured to operate based on the gated clock signal.

According to an aspect of the disclosure, the circuit includes transmitting circuits configured to transmit the encoded data that is selectively corrupted and the DBI signal. Further, in an example, the circuit includes receiving circuits configured to receive the signals that are selectively corrupted and the DBI signal, and a valid decoding circuit configured to detect a corruption in the signals and recover the valid signal in response to the corruption detection.

Aspects of the disclosure provide a method for valid encoding. The method includes encoding, by an encoding circuit, data to be transmitted as signals on a data bus to satisfy a requirement that limits a number of bit transitions between consecutive transmissions, selectively corrupting, by a valid circuit, the signals not to satisfy the requirement that limits the number of bit transitions between the consecutive transmissions to indicate whether the signals being transferred on the data bus constitute valid data or invalid data.

Aspects of the disclosure also provide an electronic device including one or more integrated circuit chips. The electronic device includes a first circuit configured to transmit data over a data bus to a second circuit in the electronic device. The first circuit includes an encoding circuit configured to encode data to be transmitted on as signals on the data bus to satisfy a requirement that limits a number of bit transitions between consecutive transmissions and a valid circuit configured to selectively corrupt the signals not to satisfy the requirement that limits the number of bit transitions between the consecutive transmissions to indicate whether the signals being transmitted on the data bus constitute valid data or invalid data.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
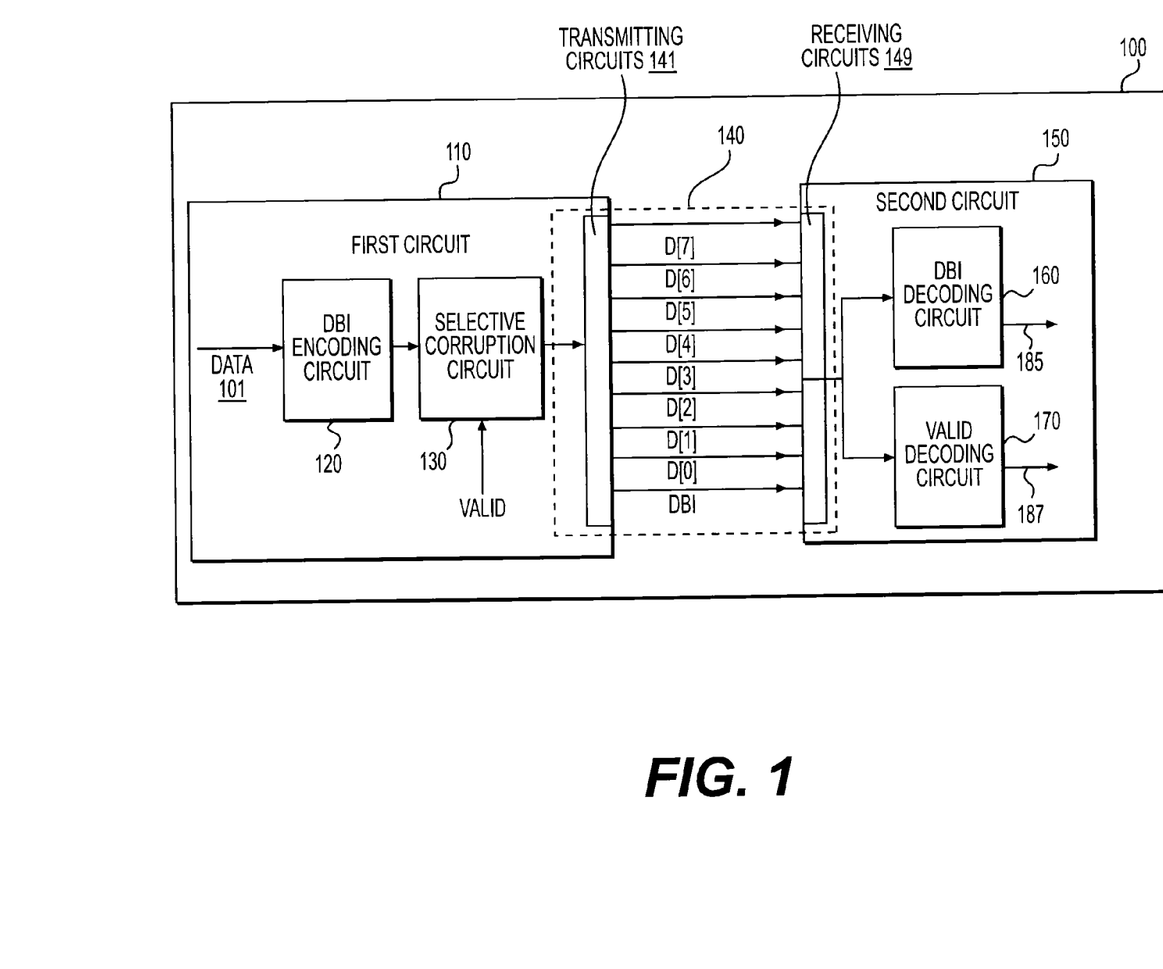
FIG. 1 shows a block diagram of an electronic system 100 according to an embodiment of the disclosure.

FIG. 1 shows a block diagram of an electronic system 100 according to an embodiment of the disclosure. The electronic system 100 is configured to transmit data from a first circuit 110 to a second circuit 150 via a channel 140 having a parallel bus using a data bit inversion (DBI) technique. In addition, the electronic system 100 is configured to encode a valid signal in the data, and transmit the encoded data with the valid signal without adding additional transmitting resource, such as a dedicated transmission line, for the valid signal in the channel 140.

The electronic system 100 can be any suitable system, such as a desktop computer, a laptop computer, a tablet computer, a smart phone, a network switch or device, a smart television, a network server, a printed circuit board (PCB), an electronic package with multiple chips, an integrated circuit (IC) chip, and the like.

In an embodiment, the electronic system 100 is an electronic package with multiple chips, such as a multi-chip module (MCM) package, a multiple chip package (MCP), and the like. In an example, the first circuit 110 and the second circuit 150 are IC chip modules, such as a northbridge chip module, a southbridge chip module, and the like, on an interposer board. The channel 140 includes transmitting circuits 141 on the first circuit 110 and receiving circuits 149 on the second circuits 150. The interposer board is configured to couple the first circuit 110 with the second circuit 150 to enable signal transmissions between the first circuit 110 and the second circuit 150.

In another embodiment, the electronic system 100 is a PCB board, and the first circuit 110 and the second circuit 150 are IC chips on the PCB board. The channel 140 includes transmitting circuits 141 on the first circuit 110, multiple copper traces (not shown) on the PCB board, and receiving circuits 149 on the second circuit 150 for example, to transmit data from the first circuit 110 to the second circuit 150.

In another embodiment, the electronic system 100 is an IC chip, and the first circuit 110 and the second circuit 150 are on-chip circuit components. The channel 140 includes multiple metal traces (not shown) on the IC chip to transmit data from the first circuit 110 to the second circuit 150, in an embodiment.

According to an aspect of the disclosure, a DBI technique, such as an AC DBI technique, is used in the electronic system 100 to minimize noise generation and reduce error probability during data transmission from the first circuit 110 to the second circuit 150. In the FIG. 1 example, the channel 140 uses a data bus of eight bits to transmit eight bits (e.g., D[0]-D[7]) in parallel from the first circuit 110 to the second circuit 150. In addition, a DBI signal is added with the data bus to indicate whether the eight bits are inverted. In an example, when the DBI signal is binary "0" (e.g., has a relatively low voltage), the eight bits are not inverted; and when the DBI signal is binary "1" (e.g., has a relatively high voltage), the eight bits are inverted.

In an embodiment, the electronic system 100 is configured in an AC DBI mode to transmit data in the form of a stream of data units. Each data unit includes multiple bits (e.g., eight bits), and the multiple bits are transmitted in parallel in a time unit (e.g., a clock cycle). The stream of data units is encoded in the AC DBI mode to limit the number of bit-transitions between consecutive transmissions.

In the FIG. 1 example, the first circuit 110 includes a DBI encoding circuit 120 configured to encode a stream of data units 101 using a DBI technique, such as an AC DBI technique. For example, when a data unit has four (half of 8-bit bus width) or less different bits from a previously encoded data unit, the DBI encoding circuit 120 outputs the data unit without inversion. In addition, the DBI encoding circuit 120 outputs binary "0" in the DBI signal to indicate no inversion during encoding. When the data unit has more than four different bits from the previously encoded data unit, the DBI encoding circuit 120 bit-inverts the data unit, and outputs the bit-inverted data unit as the encoded data unit. Thus, the encoded data unit has less than four different bits from the previously encoded data unit. In addition, the DBI encoding circuit 120 outputs binary "1" in the DBI signal to indicate bit-inversion during encoding. Thus, the maximum number of bit-transitions between consecutive encoded data units in the AC DBI mode is limited to four (half of 8-bit bus width).

In addition, according to an aspect of the disclosure, the electronic system 100 is configured to provide a valid data indication via the channel 140 without adding an additional transmitting resource (e.g., metal trace, transmitting circuit, receiving circuit, and the like). The valid data indication is used to indicate whether the signals transmitted via the channel 140 constitute valid data units or invalid data units.

In an embodiment, the data units are encoded to have a specific property. The first circuit 110 includes a selective corruption circuit 130 configured to receive a valid signal, and selectively corrupt the encoded data units in response to the valid signal not to have the specific property to indicate whether the signals transmitted via the channel 140 constitute valid data units or invalid data units are valid or not valid. In an example, the specific property is used as the valid data indication. For example, when the valid signal is binary "1" (e.g., valid), the selective corruption circuit 130 does not corrupt the encoded data units, and when the valid signal is binary "0" (e.g., invalid), the selective corruption circuit 130 corrupts the encoded data units not to have the specific property. Thus, when the signals transmitted over the channel 140 have the specific property, the valid data indication indicates that the signals constitute valid data units; and when the signals transmitted over the channel 140 do not have the specific property, the valid data indication indicates that the signals constitute invalid data units.

In an example, when the electronic system 100 is in the AC DBI mode, the DBI encoding circuit 120 encodes data units to limit the maximum number of bit-transitions between consecutive encoded data units, such as four bit-transitions for a data bus of eight bits. Further, in the example, in response to the valid signal, the selective corruption circuit 130 selectively corrupts one or more of the transmitted data units, such that the number of bit-transitions of the corrupted transmissions is larger than the maximum number of transitions between consecutive encoded data units in the AC DBI mode, for example five bit-transitions for a data bus of eight bits. In an example, the number of bit-transitions is used as the valid data indication. For example, when the valid signal is binary "1" (e.g., valid), the selective corruption circuit 130 makes no change to the encoded data units and encoded data units are transmitted as signals over the channel 140; and when the valid signal is binary "0" (e.g., not valid), the selective corruption circuit 130 makes change to the encoded data units to cause five bit-transitions between consecutive encoded data units, and the corrupted data units are transmitted as signals over the channel 140. Thus, when the number of bit-transitions between consecutive encoded data units is equal to four or less than four, the valid data indication indicates that the signals constitute valid data units; and when the number of bit-transitions between consecutive encoded units is five in an example, the valid data indication indicates that the transmitted signals constitute invalid data units.

For example, when the second circuit 150 receives the transmitted data units from the channel 140, the second circuit 150 detects corruptions. When a corruption, such as five bit-transitions for a data bus of eight bits, is detected between consecutive received data units, the second circuit 150 decodes the valid data indication that indicates an invalid data unit.

In the FIG. 1 example, the second circuit 150 includes a DBI decoding circuit 160 and a valid decoding circuit 170. The DBI decoding circuit 160 is configured to decode the data bits received from the channel 140 according to the DBI technique and output a stream of data units 185 which is the same as the original stream of data units 101 when no error happens during encoding, transmission and decoding process. In an example, when the DBI signal is binary "0", the DBI decoding circuit 160 outputs the data unit received from the channel 140; and when the DBI signal is binary "1", the DBI decoding circuit 160 bit-inverts the data unit received from the channel 140 and outputs the bit-inverted data unit.

The valid decoding circuit 170 is configured to decode the valid signal from the received data units. In an example, the valid decoding circuit 170 checks the number of bit-transitions between presently received data unit and previously received data unit. When the number of transitions is equal to four or less than four, in an example, the valid decoding circuit 170 decodes the valid data indication to indicate valid data unit; and when the number of transitions is larger than four, in an example, the valid decoding circuit 170 decodes the valid data indication to indicate invalid data unit.

It is noted that, in an embodiment, the first circuit 110 includes a DBI decoding circuit (not shown) similarly configured as the DBI decoding circuit 160 and a valid decoding circuit (not shown) similarly configured as the valid decoding circuit 170, the second circuit 150 includes a DBI encoding circuit (not shown) similarly configured as the DBI encoding circuit 120 and a selective corruption circuit (not shown) similarly configured as the selective corruption circuit 130, and the channel 140 includes transmitting circuits (not shown) with the second circuit 150 and receiving circuits (not shown) with the first circuit 110, such that the second circuit 150 can transmit data to the first circuit 110 in a similar manner described above.

It is also noted that the data transmitted by the channel 140 can be any suitable data, such as instruction, control data, memory address, memory content, and the like.

Figure 2:
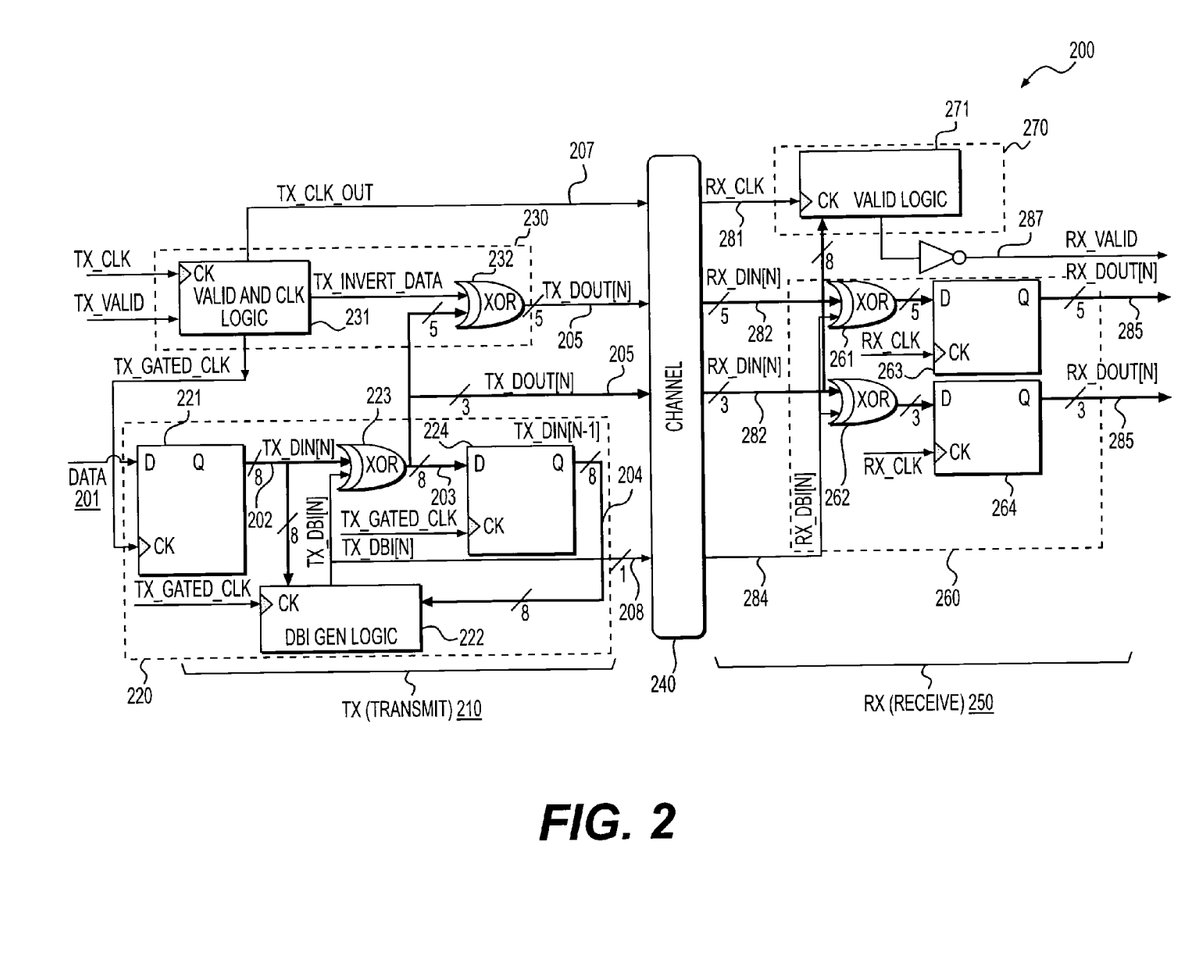
FIG. 2 shows a detailed block diagram of an electronic system 200 according to an embodiment of the disclosure.

FIG. 2 shows a detailed block diagram of an electronic system 200 according to an embodiment of the disclosure. In an example, the electronic system 200 is an implementation example for the electronic system 100. In the electronic system 200, a first circuit TX 210 transmits data to a second circuit RX 250 via a channel 240, and the second circuit RX 250 receives the data from the channel 240. The electronic system 200 is configured to use AC DBI technique to encode and transmit the data using a parallel data bus of 8-bits width, and is configured to encode a valid signal in the data, and transmit the encoded data with the valid signal without adding an additional transmitting resource dedicated for the valid signal.

In the FIG. 2 example, the first circuit TX 210 includes a DBI encoding circuit 220 and a selective corruption circuit 230. The DBI encoding circuit 220 is configured to receive a stream of data units 201 and encode the stream of data units using the AC DBI technique, such that the maximum number of bit-transitions between consecutive encoded data units is half of the data bus width, such as four in the FIG. 2 example. The selective corruption circuit 230 is configured to selectively corrupt one or more transmitted data units in response to a valid signal to encode the valid signal in the data units to be transmitted.

Specifically, the DBI encoding circuit 220 includes a first register 221, a DBI generation logic 222, a first XOR circuit 223 and a second register 224. The selective corruption circuit 230 includes a valid and clock logic 231 and a second XOR circuit 232. These elements are coupled together as shown in FIG. 2.

The DBI encoding circuit 220 receives a sequence of original data units 201, and generates encoded data units using AC DBI technique. The circuits in the DBI encoding circuit 220 are synchronized based on a first gated clock signal TX_GATED_CLK.

Specifically, in an example, the first register 221 includes eight D flip-flops configured to receive and store a stream of data units 201 in response to the first gated clock signal TX_GATED_CLK. For example, at a time, the first register 221 stores the $N^{th}$ data unit (N is a positive integer) in the sequence of data units 201, as shown by a data unit 202 (TX_DIN[N]) in the FIG. 2.

Further, in the FIG. 2 example, the second register 224 includes eight D flip-flops configured to store an encoded data unit 204 (TX_DIN[N−1]) that is the encoded data unit of the $N-1^{th}$ data unit in the sequence of data units. The DBI generation logic 222 is configured to generate a DBI signal 208 (TX_DBI[N]) based on the data unit 202 and the encoded data unit 204. In an example, when the data unit 202 has four or less different bits from the encoded data unit 204, the DBI generation logic 222 outputs binary "0" in the DBI signal 208 (TX_DBI[N]) to indicate that no inversion is needed; and when the data unit 202 has more than four different bits from the encoded data unit 204, the DBI generation logic 222 outputs binary "1" in the DBI signal 208 (TX_DBI[N]) to indicate that inversion is needed.

The first XOR circuit 223 includes, for example, eight XOR gates to use XOR logic to combine the data unit 202 with the DBI signal 208 to generate the encoded data unit 203 which is the encoded data unit of the $N^{th}$ data unit in the sequence of data units. For example, when the DBI signal 208 is binary "0", the encoded data unit 203 is the same as the data unit 202; and when the DBI signal 208 is binary "1", the first XOR circuit 223 bit-inverts the data unit 202 to generate the encoded data unit 203.

The selective corruptive circuit 230 receives a valid signal TX_VALID, generates clock signals based on the valid signal to synchronize circuit operations in response to the valid signal TX_VALID, and selectively corrupts the encoded data unit 203 based on the valid signal TX_VALID.

Specifically, in the FIG. 2 example, the valid and clock logic 231 receives a clock signal TX_CLK, such as a system clock distributed to the first circuit TX 210, and generates the first gated clock TX_GATED_CLK, a second gated clock TX_CLK_OUT, and a corruption control signal TX_INVERT_DATA based on the clock signal TX_CLK and the valid signal TX_VALID. The first gated clock TX_GATED_CLK is provided to the DBI encoding circuit 220 to synchronize the circuit operations in the DBI encoding circuit 220. The second gated clock TX_CLK_OUT is transmitted to the second circuit RX 250 via the channel 240, and is used by the second circuit RX 250 to synchronize the circuit operations at the second circuit RX 250. In an embodiment, the corruption control signal TX_INVERT_DATA is provided to the second XOR circuit 232 to selectively corrupt encoded data units.

In an example, when the valid signal TX_VALID is binary "1", the first gated clock signal TX_GATED_CLK and the second gated clock signal TX_CLK_OUT are active, and clock transitions (e.g., rising edges, falling edges) of the first gated clock signal TX_GATED_CLK and the second gated clock signal TX_CLK_OUT follow the transitions of the clock signal TX_CLK. In response to a binary "0" in the valid signal TX_VALID, the first gated clock signal TX_GATED_CLK and the second gated clock signal TX_CLK_OUT are suitably gated to temporarily stop clock transitions. It is noted that the first gated clock signal TX_GATED_CLK and the second gated clock signal TX_CLK_OUT can have the same or different gated clock cycles.

In an example, the first gated clock signal TX_GATED_CLK is gated for two clock cycles and the second gated clock signal TX_CLK_OUT is gated for one clock cycle in response to binary "0" in the valid signal TX_VALID. The first gated clock signal TX_GATED_CLK is provided to the DBI encoding circuit 220 to halt the DBI encoding circuit 220 for two clock cycles in order to hold the last data unit 203. The second gated clock signal TX_CLK_OUT is provided to the second circuit RX 250 to decode the valid signal.

In the FIG. 2 example, the second XOR circuit 232 includes, for example, five XOR gates to use XOR logic to respectively combine five bits of the encoded data unit 203 with the corruption control signal TX_INVERT_DATA to corrupt the encoded data unit 203. For example, when the corruption control signal TX_INVERT_DATA is binary "0", the encoded data unit 203 is not corrupted, the data unit 205 (TX_DOUT[N]) for transmission is the same as the encoded data unit 203. When the corruption control signal TX_INVERT_DATA is binary "1", the second XOR circuit 232 bit-inverts five bits of the encoded data unit 203 to corrupt the encoded data unit 203. The data unit 205 for transmission includes five bits that are bit inverted, and another three bits from the encoded data unit 203. The data bit 205 is transmitted with the DBI signal 208 and the second gated clock TX_CLK_OUT over the channel 240.

The channel 240 includes suitable circuit components, such as transmitting circuits, metal traces, receiving circuits and the like, to transmit the data unit 205, the DBI signal 208 and the second gated clock TX_CLK_OUT from the first circuit TX 210 to the second circuit RX 250.

The second circuit RX 250 receives a gated clock signal 281 (RX_CLK), a sequence of data units 282 (e.g., RX_DIN[N]), and a DBI signal 284 (e.g., RX_DBI[N]). In the FIG. 2 example, the second gated clock TX_CLK_OUT is transmitted to the second circuit RX 250 and is used as the gated clock signal 281. The gated clock signal 281 is provided to various circuits to synchronize circuit operations. The second circuit RX 250 detects corruptions in the sequence of data units 282 to decode a valid signal RX_VALID, and decodes the data unit 282 based on the DBI signal 284 to output the decoded signal 285.

In the FIG. 2 example, the second circuit RX 250 includes a DBI decoding circuit 260 and a valid decoding circuit 270. The DBI decoding circuit 260 is configured to receive a data unit RX_DIN[N] and a corresponding DBI signal (e.g., RX_DBI[N]), and decode the data unit RX_DIN[N] based on the DBI signal. In an example, the DBI decoding circuit 260 includes XOR circuits 261-262 and registers 263-264. The XOR circuits 261-263 combine the data unit RX_DIN[N] with the DBI signal RX_DBI[N] using XOR logic to decode the data unit, and the registers 263-264 store and output the decoded data unit 285 (e.g., RX_DOUT[N]). In an example, when the DBI signal RX_DBI[N] is binary "0", the decoded data unit RX_DOUT[N] is the same as the received data unit RX_DIN[N]; and when the DBI signal RX_DBI[N] is binary "1", the received data unit RX_DIN[N] is bit-inverted to generate the decoded data unit RX_DOUT[N].

The valid decoding circuit 270 receives consecutive data units 282. In an example, the valid decoding circuit 270 includes a register (not shown) configured to store the data unit RX_DIN[N−1] received previously. Further, when the valid decoding circuit 270 receives the data unit RX_DIN[N], the valid decoding circuit 270 determines the number of bit-transitions between the received data units RX_DIN[N−1] and RX_DIN[N], detects corruption, and decodes the valid signal RX_VALID. In an example, when the number of bit-transitions between the received data units RX_DIN[N−1] and RX_DIN[N] is four or less, the valid decoding circuit 270 maintains a constant output, such as a binary "1" in the valid signal RX_VALID; and when the number of bit-transitions between the received data units of consecutive clocks is larger than four, such as five, the valid decoding circuit 270 outputs a binary "0" in the valid signal RX_VALID.

Figure 3:
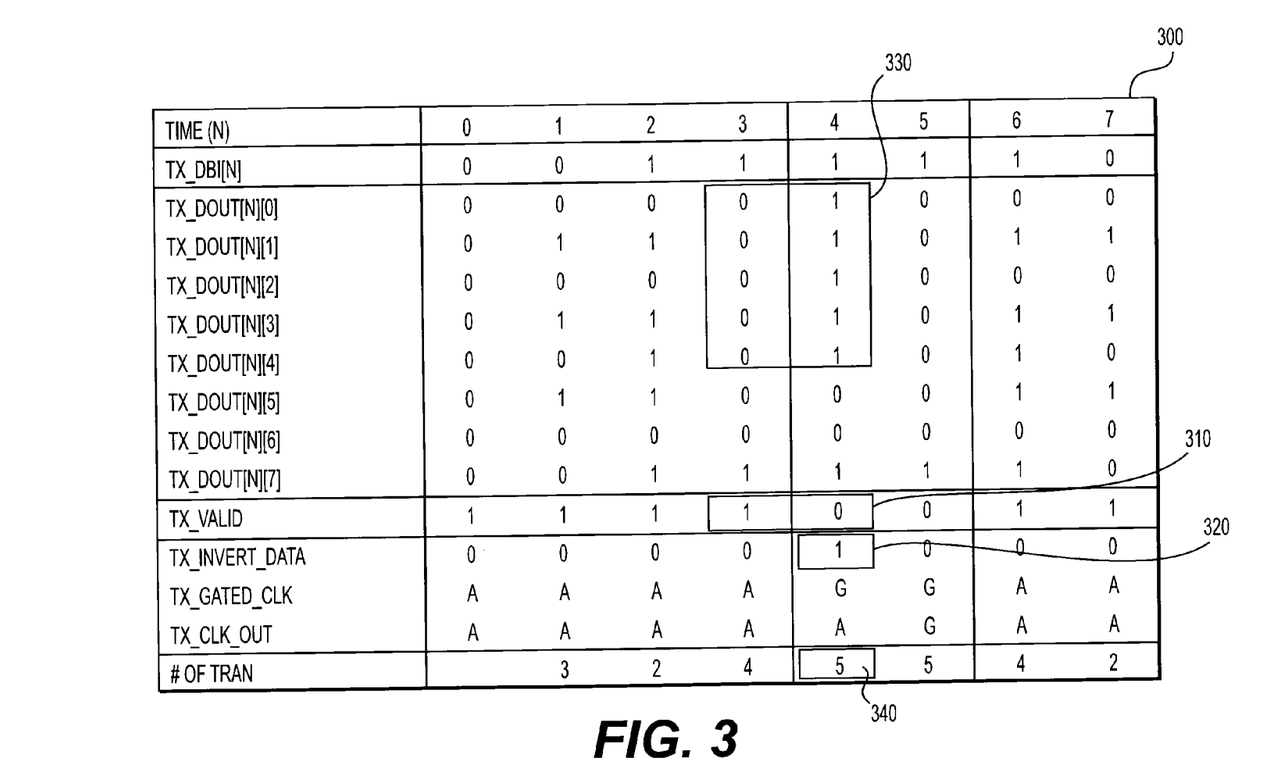
FIG. 3 shows a table of data bits at a transmitting side according to an embodiment of the disclosure.

FIG. 3 shows a table 300 of signal values at different times (e.g., $0^{th}$ clock to $7^{th}$ clock) for the first circuit TX 210 in the FIG. 2 example according to an embodiment of the disclosure.

In the FIG. 3 example, when the valid signal TX_VALID is binary "1", for example from 0 clock to $3^{rd}$ clock, $6^{th}$ clock and $7^{th}$ clock, the first gated clock signal TX_GATED_CLK and the second gated clock signal TX_CLK_OUT are active as shown by "A". Each transmitted data unit TX_DOUT[N] has eight bits TX_DOUT[N][0] to TX_DOUT[N][7]. The transmitted data unit TX_DOUT[N] has been encoded, such that the number of bit-transitions (# of TRAN) between the consecutive clocks is equal to or less than four, and the DBI signal TX_DBI[N] indicates whether the transmitted data unit TX_DOUT[N] has been bit-inverted.

When the valid signal TX_VALID is binary "0", as shown by 310 in $4^{th}$ clock, the first gated clock signal TX_GATED_CLK is gated for two clock cycles at $4^{th}$ clock and $5^{th}$ clock, as shown by "G" in the table 300, and the second gated clock signal TX_CLK_OUT is gated for one clock cycle at $5^{th}$ clock as shown by "G" in the table 300.

At the $4^{th}$ clock, because the first gated clock signal TX_GATED_CLK is gated, thus the first register 221 and the second register 224 maintain the stored data units. However, because the TX_VALID signal is binary "0", the corruption control signal TX_INVERT_DATA is binary "1" as shown by 320, thus five bits of the transmitted data unit TX_DOUT[N] are bit-inverted, as shown by 330, to corrupt the transmitted data unit TX_DOUT[N]. The number of bit-transitions between $3^{rd}$ clock and $4^{th}$ clock is five as shown by 340.

At the $5^{th}$ clock, the first gated clock signal TX_GATED_CLK is still gated and the first register 221 and the second register 224 maintain the stored data units. In this example, the corruption control signal TX_INVERT_DATA returns to binary "0". The transmitted unit TX_DOUT[N] is the same as in the $3^{rd}$ clock.

Figure 4:
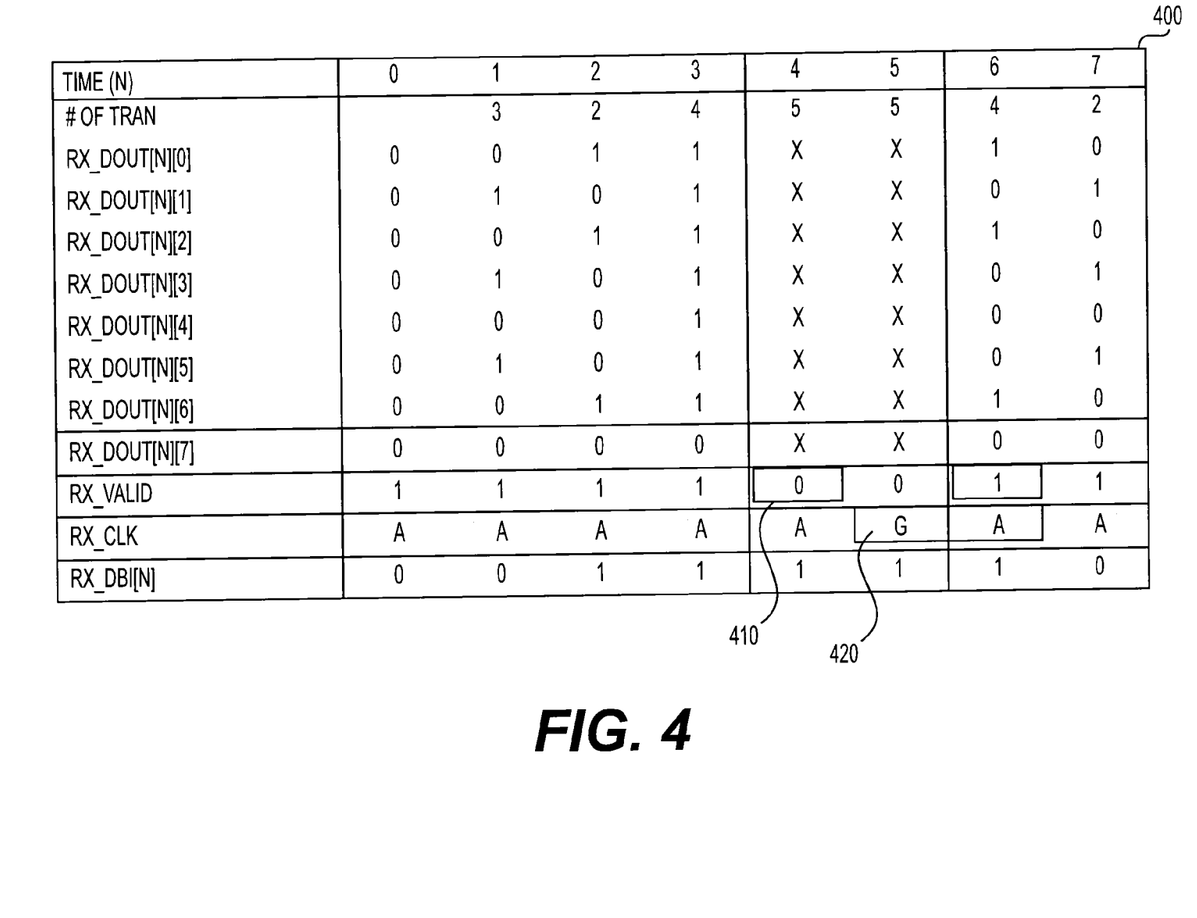
FIG. 4 shows a table of data bits at a receiving side according to an embodiment of the disclosure.

FIG. 4 shows a table 400 of signal values at different time (e.g., 0 clock to $7^{th}$ clock) for the second circuit RX 250 in the FIG. 2 example according to an embodiment of the disclosure.

In the FIG. 4 example, when the number of bit-transitions (# OF TRAN) between the received data units (e.g., RX_DIN[N]) in consecutive cycles is equal to or less than four, for example from $1^{st}$ clock to $3^{rd}$ clock, $6^{th}$ clock and $7^{th}$ clock, the valid signal RX_VALID is binary "1". When the number of bit-transitions between the received data units in consecutive cycles is larger than four, such as in $4^{th}$ clock, the valid decoding circuit 270 outputs binary "0" in the decoded valid signal RX_VALID. In the $5^{th}$ clock, due to the gated cycle in the clock signal RX_CLK as shown by 420, the decoded valid signal remains binary "0".

In the FIG. 2 example, the electronic system 200 uses gated clock signals to halt encoding of new data unit in order to corrupt the transmitted data unit. It is noted that, in another example, an electronic system does not need to gate the clock signals in order to selectively corrupt the transmitted data unit.

Figure 5:
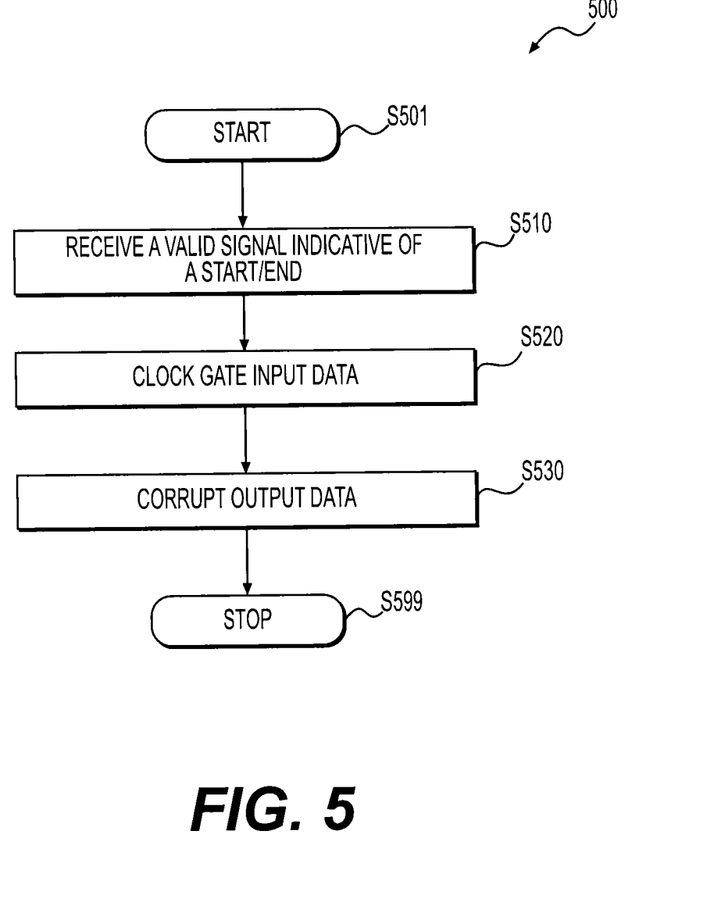
FIG. 5 shows a flow chart outlining a process for transmitting a valid signal.

FIG. 5 shows a flow chart outlining a process 500 for encoding a valid signal according to an embodiment of the disclosure. In an example, the process 500 is executed by the first circuit TX 210 in the FIG. 2 example. The process starts at S501 and proceeds to S510.

At S510, a valid signal indicative of valid data units or invalid data units is received. In the FIG. 2 example, the first circuit TX 210 receives a valid signal that uses binary "1" to indicate a valid data unit and uses binary "0" to indicate an invalid data unit.

At S520, data input is gated. In the FIG. 2 example, the valid and clock logic 231 gates the first gated clock signal TX_GATED_CLK and the second clock signal TX_CLK_OUT in response to the valid signal. For example, when the valid signal is binary "0", the first gated clock signal TX_GATED_CLK is gated, and the second gated clock signal TX_CLK_OUT is gated. When the first gated clock signal TX_GATED_CLK is gated, the first register 221 and the second register 224 maintain the stored data units without inputting new data units.

At S530, output data is corrupted to encode the valid signal. In the FIG. 2 example, the valid and clock logic 231 outputs the corruption control signal TX_INVERT_DATA in response to the valid signal. For example, when the valid signal is binary "0", the corruption control signal TX_INVERT_DATA is set to binary "1". Thus, the second XOR circuit 232 combines the corruption control signal TX_INVERT_DATA with five bits of the encoded data unit 203 to generate the data unit 205 for transmission. Then, the data unit 205 is transmitted. The process proceeds to S599 and terminates.

Figure 6:
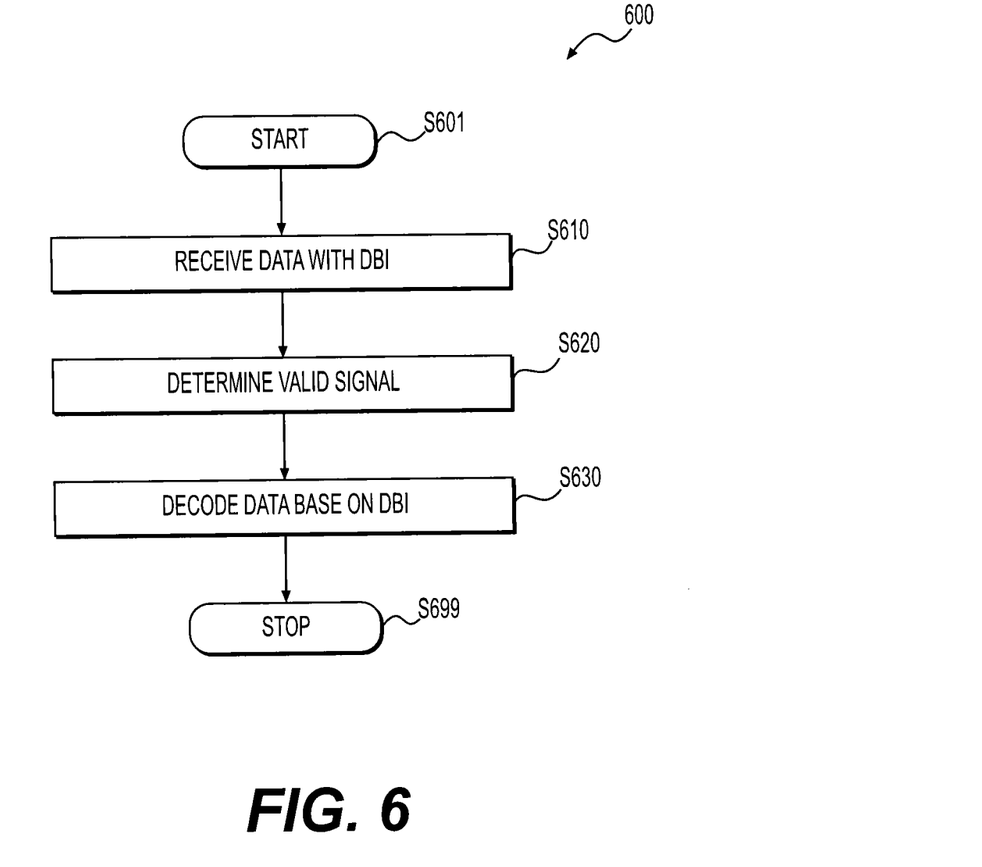
FIG. 6 shows a flow chart for decoding a valid signal.

FIG. 6 shows a flow chart outlining a process example 600 for decoding DBI data units according to an embodiment of the disclosure. In an example, the process 600 is executed by the second circuit RX 250 in the FIG. 2 example. The process starts at S601 and proceeds to S610.

At S610, a sequence of data units with DBI signal is received. The data units are DBI encoded. In addition, one or more of the data units are selectively corrupted to encode a valid signal in the data units.

At S620, the valid signal is decoded from the sequence of data units. In the FIG. 2 example, the valid logic circuit 270 detects corruptions in the sequence of data units. In an example, the valid logic circuit 270 detects a number of bit-transitions between consecutive data units that each has 8 bits. When the number of bit-transitions is four or less, the valid logic circuit 270 outputs binary "1" in the decoded valid signal RX_VALID to indicate valid data unit; and when the number of bit-transitions is larger than four, the valid logic circuit 270 outputs a binary "0" in the decoded valid signal RX_VALID to indicate invalid data unit.

At S630, the data units are DBI decoded. In the FIG. 2 example, when the received DBI signal RX_DBI[N] is binary "0", the received data unit is output as the decoded data unit; and when the received DBI signal RX_DBI[N] is binary "1", the received data unit is bit-inverted and the bit-inverted data unit is output as the decoded data unit. The process proceeds to S699 and terminates.

It is noted that, in an example, the step S620 and the S630 are executed in parallel by separate circuit blocks.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
    an encoding circuit configured to encode data to be transmitted as signals on a data bus to satisfy a requirement that limits a number of bit transitions between consecutive transmissions; and
    a valid circuit configured to selectively corrupt the signals not to satisfy the requirement that limits the number of bit transitions between the consecutive transmissions and indicate whether the signals to be transmitted on the data bus constitute valid data or invalid data by the selective corruption of the signals.

2. A method for valid encoding, comprising:
    encoding, by an encoding circuit, data to be transmitted as signals on a data bus to satisfy a requirement that limits a number of bit transitions between consecutive transmissions; and
    selectively corrupting, by a valid circuit, the signals not to satisfy the requirement that limits the number of bit transitions between the consecutive transmissions; and
    indicating whether the signals being transferred on the data bus constitute valid data or invalid data by the selective corruption of the signals.

3. An electronic device including one or more integrated circuit chips, comprising:
    a first circuit configured to transmit data over a data bus to a second circuit in the electronic device, wherein the first circuit comprises:
        an encoding circuit configured to encode data to be transmitted on as signals on the data bus to satisfy a requirement that limits a number of bit transitions between consecutive transmission, wherein the encoding circuit further comprises a logic circuit configured to generate a data-bit inversion (DBI) signal based on bit transitions between signals to be transmitted as a first data unit, and a second data unit subsequent to the first data unit, and an XOR circuit configured to combine the second data unit with the DBI signal to encode the second data unit; and
        a valid circuit configured to selectively corrupt the signals not to satisfy the requirement that limits the number of bit transitions between the consecutive transmissions to indicate whether the signals being transmitted on the data bus constitute valid data or invalid data.

4. The electronic device of claim 3, wherein:
    the encoding circuit is configured to encode the data to be transmitted as the signals on the data bus to satisfy the requirement that limits a maximum number of bit transitions between the consecutive transmissions to be a half width of the data bus.

5. The electronic device of claim 3, wherein the valid circuit comprises:
    a logic circuit configured to generate a corruption inversion signal in response to a valid signal that indicates whether the signals to be transmitted on the data bus constitute valid data or invalid data; and an XOR circuit configured to combine at least a portion of the encoded data with the corruption inversion signal.

6. The electronic device of claim 5, wherein the logic circuit is configured to gate a clock signal in response to the valid signal, and the encoding circuit is configured to operate based on the gated clock signal.

7. The electronic device of claim 3, wherein the second circuit comprises:
a valid decoding circuit configured to detect a corruption in the signals and recover the valid signal in response to the corruption detection; and
a DBI decoding circuit configured to decode the data based on the DBI signal.

8. A circuit, comprising:
an encoding circuit configured to encode data to be transmitted as signals on a data bus to satisfy a requirement that limits a number of bit transitions between consecutive transmissions;
a valid circuit configured to selectively corrupt the signals not to satisfy the requirement that limits the number of bit transitions between the consecutive transmissions to indicate whether the signals to be transmitted on the data bus constitute valid data or invalid data;
a logic circuit configured to generate a data-bit inversion (DBI) signal based on bit transitions between signals to be transmitted as a first data unit, and a second data unit subsequent to the first data unit; and
an XOR circuit configured to combine the second data unit with the DBI signal to encode the second data unit.

9. The circuit of claim 8, wherein:
the encoding circuit is configured to encode the data to be transmitted as the signals on the data bus to satisfy the requirement that limits a maximum number of bit transitions between the consecutive transmissions to be a half of a data bus width.

10. The circuit of claim 8, wherein the valid circuit comprises:
a logic circuit configured to generate a corruption inversion signal in response to a valid signal that indicates whether the signals being transmitted on the data bus constitutes valid data or invalid data; and
an XOR circuit configured to combine at least a portion of the encoded data with the corruption inversion signal.

11. The circuit of claim 10, wherein the logic circuit is configured to gate a clock signal in response to the valid signal, and the encoding circuit is configured to operate based on the gated clock signal.

12. The circuit of claim 8, further comprising:
transmitting circuits configured to transmit the encoded data that is selectively corrupted and the DBI signal.

13. The circuit of claim 12, further comprising:
receiving circuits configured to receive the signals that is selectively corrupted and the DBI signal; and
a valid decoding circuit configured to detect a corruption in the signals and recover the valid signal in response to the corruption detection.

14. A method for valid encoding, comprising:
encoding, by an encoding circuit, data to be transmitted as signals on a data bus to satisfy a requirement that limits a number of bit transitions between consecutive transmissions;
selectively corrupting, by a valid circuit, the signals not to satisfy the requirement that limits the number of bit transitions between the consecutive transmissions to indicate whether the signals being transferred on the data bus constitute valid data or invalid data;
generating a data-bit inversion (DBI) signal based on bit transitions between signals that constitute a first data unit, and a second data unit subsequent to the first data unit; and
bit-inverting the second data unit based on the DBI signal to encode the second data unit.

15. The method of claim 14, wherein encoding, by the encoding circuit, the data to be transmitted as the signals on the data bus to satisfy the requirement that limits the number of bit transitions between the consecutive transmissions further comprises:
encoding the data to be transmitted as the signals on the data bus to satisfy the requirement that limits a maximum number of bit transitions between the consecutive transmissions to be a half of a data bus width.

16. The method of claim 14, wherein selectively corrupting, by the valid circuit, the signals not to satisfy the requirement that limits the number of bit transitions between the consecutive transmissions to indicate whether the signals being transmitted on the data bus constitute valid data or invalid data further comprises:
generating a corruption inversion signal in response to a valid signal that indicates whether the signals to be transmitted on the data bus is valid or invalid; and
bit-inverting at least a portion of the encoded data based on the corruption inversion signal.

17. The method of claim 16, further comprising:
gating a clock signal in response to the valid signal; and
providing the gated clock signal to synchronize the encoding circuit.

18. The method of claim 14, further comprising:
transmitting the signals that are selectively corrupted and the DBI signal over the data bus.

19. The method of claim 18, further comprising:
receiving the signals that are selectively corrupted and the DBI signal;
detecting a corruption in the signals that the requirement is not satisfied and recovering the valid signal in response to the corruption detection.

* * * * *